United States Patent [19]

DeFreitas

[11] 4,305,050
[45] Dec. 8, 1981

[54] CIRCUITRY FOR GENERATING REFERENCE SIGNAL FOR DELTA ENCODING SYSTEMS

[75] Inventor: Richard E. DeFreitas, Westford, Mass.

[73] Assignee: DeltaLab Research, Inc., Chelmsford, Mass.

[21] Appl. No.: 71,246

[22] Filed: Aug. 30, 1979

Related U.S. Application Data

[63] Continuation-in-part of Ser. No. 875,336, Feb. 6, 1978, Pat. No. 4,190,801.

[51] Int. Cl.³ .............................................. H03K 13/22
[52] U.S. Cl. ..................... 332/11 D; 375/29
[58] Field of Search ............... 332/11 D; 329/104; 375/25, 26, 27, 28, 29, 30, 32, 33, 34, 94

[56] References Cited

U.S. PATENT DOCUMENTS

| | | | |
|---|---|---|---|
| 3,727,135 | 4/1973 | Holzer | 332/11 D X |
| 3,857,111 | 12/1974 | Deschenes et al. | 375/32 X |
| 4,071,825 | 1/1978 | McGuffin | 375/29 |

Primary Examiner—Siegfried H. Grimm
Assistant Examiner—Edward P. Westin

[57] ABSTRACT

In an electrical system of the type in which a digitally encoded signal is determined at least in part by the difference between a present value of an input signal and a reference signal representative of a past value of the input signal, improved circuitry for generating the reference signal. The improved circuitry comprises extraction means including a filter for extracting from the pattern of bits in the digitally encoded signal information relating to the time derivative of the present value of the input signal and an envelope detector for processing the output of the filter to provide a control signal, and integrating means responsive to the control signal to provide the reference signal.

29 Claims, 2 Drawing Figures

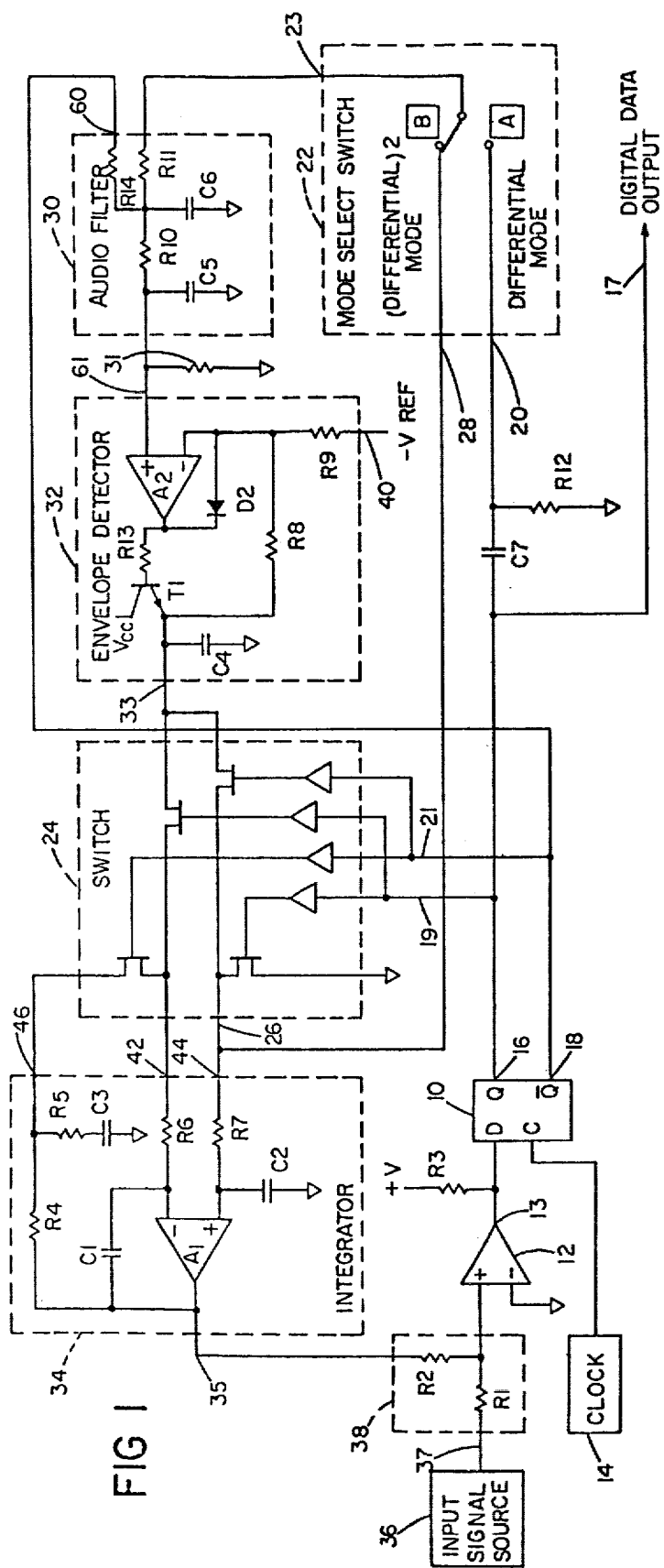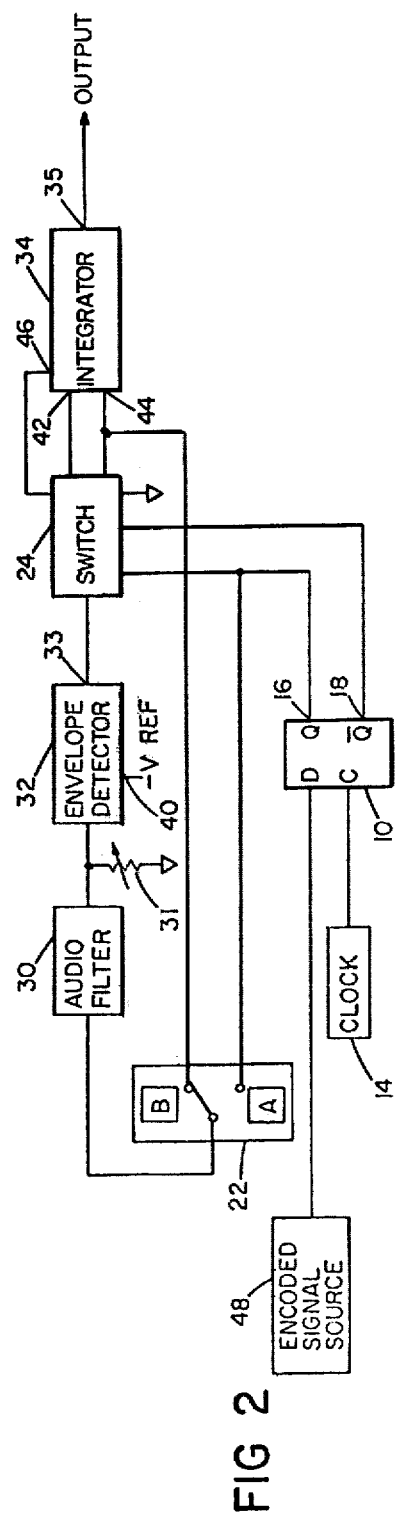

CIRCUITRY FOR GENERATING REFERENCE SIGNAL FOR DELTA ENCODING SYSTEMS

BACKGROUND OF THE INVENTION

This application is a continuation in part of U.S. Pat. No. 4,190,801, application Ser. No. 875,336, filed Feb. 6, 1978.

This invention relates to digitally encoding and decoding electrical signals, e.g., to efficiently store music on magnetic tape or to time delay music to simulate effects of reflected sound.

In a continuously variable slope delta (CVSD) encoding system, the encoded signal represents the slopes of individual line segments which together approximate the input signal, and is generated by determining, for each segment, the difference between the input signal and a reference signal whose value is determined by the previous segments of the input signal. In the most rudimentary delta encoding system, the digital output of the encoder represents, at sequential points in time, whether the input signal is greater or less than the reference, and the reference is increased or decreased, at a constant rate, accordingly. To improve the accuracy of the encoding and reduce the quantization noise introduced by the encoding process, a CVSD system increases and decreases the reference signal at a variable rate corresponding as closely as possible to the magnitude of the instantaneous slope of the input signal.

Deschenes et al. U.S. Pat. No. 3,857,111 and McGuffin U.S. Pat. No. 4,071,825 each compute the reference by integrating an intermediate signal that is produced by filtering the digital signal. Deschenes et al. rectifies and filters the digital signal a second time. McGuffin teaches that the intermediate signal is indicative of the absolute value of the derivative of the analog signal.

The Harris, Inc., HR-3210 and the Motorola, Inc., XC3417/18 modulators/demodulators have syllabic filters examining the digital output to detect continuous series of 1's or 0's, indicating a too great or too small rate of change of the reference, and modifying that rate accordingly. In De Boer et al. U.S. Pat. No. 3,490,045, the digital output is integrated to obtain a voltage representing the relative occurrence of 1's and 0's in the output and, if the resulting voltage exceeds a threshold, the rate of change of the reference is changed accordingly. Linder U.S. Pat. No. 3,109,987 and Gaunt U.S. Pat. No. 3,582,784 show encoders wherein the previous rate of change of the reference is detected and utilized to determine the future rate of change.

SUMMARY OF THE INVENTION

Encoding systems of this general type feature a reference signal generating circuit with a filter for extracting from the pattern of digital output bits information relating to the time derivative of the input signal to provide a control signal for an integrator which, in turn, generates the reference. As the control signal varies with the derivative of the input signal, the rate of change of the reference is greater for more rapidly varying input signals and less for less rapidly varying input signals, so that the reference closely follows the input signal and the quantization noise is minimized.

My invention features, in one aspect, an envelope detector used in combination with a filter to provide a control signal for integration that rises rapidly to follow increases in the derivative-related output of the filter but that decays slowly upon decreases in the filter output, thus providing excellent dynamic range while also making the quantization noise less audible by making the amplitude of the noise decay slowly.

In another aspect, my invention features supplying the filter with an input consisting of a small percentage of the digitally-encoded signal mixed with the control signal gated by the encoded signal. The mixture provides excellent response against frequency and amplitude variations in the input signal and improves tracking between the input and the decoded output at low slew rates.

Preferred Embotiment

We turn now to description of the circuitry and operation of a preferred embodiment of the invention, after first briefly describing the drawings.

DRAWINGS

FIG. 1 is a schematic diagram of a CVSD encoder embodying the invention.

FIG. 2 is a block diagram of a CVSD decoder embodying the invention.

CIRCUITRY

Referring to FIG. 1, D type flip-flop 10 is connected to sample output 13 of comparator 12 at a rate controlled by 250 KHz clock 14, to provide mutually inverted outputs 16 and 18. Output 18 of flip-flop 10 is connected to input 60 of lowpass filter 30. Output 16 is connected to encoded signal output 17 of the encoder and to differential input 20 of mode select switch 22, and outputs 16 and 18 are connected to the control inputs 19 and 21 of integrator switch 24. Output 26 of switch 24 is connected to (differential)$^2$ input 28 of switch 22, and output 23 of switch 22 is connected to the series combination of filter 30, envelope detector 32, switch 34, and differential integrator 34. Output 35 of integrator 34 and output 37 of audi signal source 36 are connected to summing point 38 to provide the input to comparator 12.

Filter 30 is a pi section lowpass filter having a bandwidth of 25 KHz, approximately 1.7 times the 15 KHz bandwidth of the input signal, with resistor 31 assisting to shape the frequency response of the filter. Envelope detector 32 is a half wave rectifier having a hold time constant in the range of 20 to 70 ms, and preferably 60 ms, and a full scale (10 v) slew time of 1667 $\mu$s. Transistor T1 at the output of op. amp. A2 helps supply current to charge capacitor C4 to minimize the slew time. Integrator switch 24 is a solid state C-MOS analog switch containing four independently controlled switches and shown here in block diagram form to illustrate the operation of the encoder. Integrator 34 is self-stabilized with a selectable positive or negative integration slew rate of 0.25 v/$\mu$s at a maximum control signal of 10 volts and a slew rate of 2.5 mv/$\mu$s at a control signal of 0.1 volts.

The following table contains the circuit components used in the circuit of FIG. 1, and are optimum for the (differential)$^2$ mode of operation.

COMPONENT TABLE

R1—10K$\Omega$, 5%
R2—10K$\Omega$, 5%
R3—510$\Omega$, 5%
R4—6.8K$\Omega$, 5%
R5—510$\Omega$, 5%
R6—40.2K$\Omega$, 1%
R7—40.2K$\Omega$, 1%
R8—20K$\Omega$, 1%

COMPONENT TABLE-continued

R9—200KΩ, 1%
R10—10KΩ, 1%
R11—10KΩ, 1%
R12—10KΩ, 5%
R13—510Ω, 5%
R14—3MΩ, 5%
Resistor 31 (encoder) 1MΩ, 5%
Resistor 31 (decoder) 2MΩ carbon resistance potentiometer
C1—1000pf, 5%
C2—1000pf, 5%
C3—10μf, 10%
C4—3.3μf, 10%
C5—330pf, 5%
C6—680pf, 5%
C7—15μf, 10%

A1—Operational Amplifier (½) Motorola, Inc. MC 1458 or equivalent

A2—Operational Amplifier (½) Motorola, Inc. MC 1458 or equivalent

Comparator 12—National Semiconductor LM311 or equivalent

D2—Diode 1N4148

T1—Transistor 2N2222

Switch 24—C-MOS Quad Analog Switch RCA CD4016BE or equivalent

Flip-Flop 10—C-MOS Flip-Flop (½) RCA CD4013BE or equivalent

Referring to FIG. 2, the decoder, shown in block diagram form, contains the same circuit elements connected in the same manner as the decoder of FIG. 1, except that comparator 12 and summing point 38 are omitted and resistor 31 is variable. The encoded signal is connected to the input of the decoder flip-flop while the integrator provides the output.

Operation

Referring again to FIG. 1, output 13 of comparator 12 and output 16 of flip-flop 10 are digital signals which are high when output 37 of audio signal source 36 (the input signal) is greater than reference signal output 35 of integrator 34 and low when the input signal is smaller than the reference. The value of the reference is determined by the previous values of the input signal so that output 16 represents the difference between the present and previous values of the input signal. The change with time, i.e., duty cycle, of output 16 represents the derivative (with respect to time) of the input signal. That is, when the digitally encoded signal on output 16 has a preponderance of 1's (a high duty cycle), the derivative is high; when the encoded signal has a preponderance of 0's (a low duty cycle), the derivative is low.

When the encoder is operating in the differential mode, with switch 22 in the A position, output 16 is ac coupled into the input of filter 30, and the filter 30 extracts the information relating to the derivative of the input signal by separating the fundamental frequency of the duty cycle of output 16 from the other frequencies present in output 16, e.g., clock 14 and the higher harmonics of output 16. For example, a preponderance of 1's in output 16, corresponding to a high derivative, produces a high positive filter output. Resistor 31 assists in shaping the response of filter 30 and detector 32 by loading the input of detector 32 with a known, fixed resistance. Resistor 31 in the decoder performs the same function but is a variable resistor with a mid-range value equal to resistor 31 in the encoder, to allow the response of the decoder to be matched to that of the encoder. In the embodiment shown, the encoder and decoder may be matched to within ±0.5 db. Input 60 to filter 30 is best disconnected in the differential mode.

Envelope detector 32 half-wave detects the output of filter 30 to generate output 33 whose value is proportional to the duty cycle of output 16 and thereby to the derivative of the input signal. Referring to FIG. 1, capacitor C4 provides the above-mentioned hold time constant, and, as can be readily seen from the circuit, output 33 closely follows filter output 61 when it rises above the present value of output 33, limited only by the rate at which op. amp. A2 and transistor T1 can charge capacitor C4. Conversely, output 33 decays slowly when filter output 61 drops, limited by the discharge rate of capacitor C4. Thus, because the envelope detector allows output 33 to rise rapidly but decay slowly, the slopes of the individual segments of reference output 35 (and the decoded output) increase rapidly to track rapid increases in the input, but decrease slowly, thus making the quantization noise decay slowly and appear as steady, and less audible, background noise. The reference output 35 continues to follow the input signal during both increases and decreases, but along a decreasing portion of the input the reference output will for a short interval (about 60 ms) contain more than the usual quantization noise (i.e., more of a sawtooth appearance). Maintaining the segment slopes at a high level for this short interval means the input is less accurately encoded and that more quantization noise is produced, but the slow change in the amplitude of the noise makes the noise less audible than if the segment slopes decreased rapidly to accurately encode the input.

Standby reference input 40 to detector 32 is provided to provide a known offset for the detector when the input signal, and hence the output of filter 30, are zero, and may typically be as low as −40 db (i.e., about 0.1 v) referenced to the maximum output of filter 30.

Integrator switch 24, operating under the control of inputs 19 and 21 from outputs 16 and 18, applies output 33 of detector 32 to inputs 42 and 44 of integrator 34 when, respectively, the input signal is greater than or less than the reference. Reference output 35 of integrator 34 increases at a rate proportional to the value of output 33 of detector 32, and thus to the derivative of the input signal, when detector output 33 is applied to input 42 and decreases accordingly when detector output 33 is applied to input 44. Inputs 42 and 44 are connected by switch 24, to, respectively, output 46 of integrator 34 and ground when they are not switched to detector output 33, thereby making integrator 34 self-stabilizing by chopping inputs 42 and 44 with outputs 16 and 18.

Reference output 35 of integrator 34 is the integrated derivative of the input signal and thereby closely follows the input signal by being a reconstruction of the input signal delayed in time by the period of clock 14.

The dynamic range of the encoder and decoder, when operating in the differential mode, is on the order of 60 to 70 db when the frequency of clock 14 is at least 10 times, and preferably between 15 and 25 times, the highest input signal frequency; and is frequency weighted by the ratio between the bandwidths of output 16 and output 37 of signal source 36.

The dynamic range of the encoder and decoder are further improved when operating in the preferred (differential)$^2$ mode. Dynamic ranges of better than 85 db may be achieved when the frequency of clock 14 is at least 15 times the highest input signal frequency, and to better than 90 db when the ratio is as high as 25 to 1. In this mode, switch 22 is placed in the B position, so that the input of filter 30 is output 26 of switch 24. The operation of switch 24 is controlled by outputs 16 and 18 of flip-flop 10, so that the input to filter 30 is the control signal modulated by the encoded signal, being a series of pulses which are time coincident with outputs 16 and 18, but, effectively, amplitude modulated by output 33 of detector 32, i.e., proportional to the derivative of the input signal. Future values of control signal output 33 are thereby determined, in part, by the present value of output 33 so that output 33 changes rapidly when the derivative of the input signal is large, i.e., when the input signal is changing rapidly, and changes less rapidly when the derivative is small. The forward loop gain in this mode is of course greater than one and less than two for operability, and is preferably 1.1. Loop gain is measured between output 26 and the input to filter 30.

Input 60 to the filter mixes in a small proportion of straight digital signal as well, to assure that the decoded output tracks the input at low slew rates. Such a small amount of straight digital signal detracts very little from the excellent dynamic range in differential-squared mode. At low slew rates, the control signal can be as low as 0.1 v, the value of standby reference input 40. With such a low value as the only input to filter 30, differences in component tolerances between the decoding circuitry (e.g., in blocks 30, 32, 24, and 34) in the encoder and decoder can cause the decoder output to poorly track the input. With input 60 also connected to filter 30, output 18 is a sizeable fraction of the input to filter 30 at low slew rates because output 18 is about 15 v peak-to-peak as compared to only about 0.1 v peak-to-peak for the modulated control signal. The large fraction of straight digital signal is sufficient to improve tracking between the control signals in the encoder and decoder and thus to improve tracking between the decoder output and the input signal. At high slew rates, the control signal rises to as high as about 10 v and is the dominant input to filter 30, thereby providing the improved dynamic range of the (differential)$^2$ mode.

Referring to FIG. 2, an encoded signal from source 48 is applied to the input of decoder flip-flop 10 and is sampled at the same clock rate as in the encoder, so that outputs 16 and 18 of the decoder flip-flop are the same as those in the encoder. Audio filter 30, detector 32, switch 24, and integrator 34 generate reference signal output 35 in the same manner as, and identical to, that generated by the encoder (except for the small component tolerances discussed above). The integrator output is the decoder output and (as is the encoder reference signal) is an accurate reconstruction of the encoder input signal, tracking the encoder input to within ±0.5 db.

Other embodiments are within the following claims. E.g., while the embodiment of the invention described above relates to a CVSD system, the invention may be used in other encoding and decoding systems wherein the encoded signal represents the difference between a present value of the input signal and previous values of the input signal. Examples of such systems are voltage to frequency modulators, pulse width modulators, delta sigma modulators, and some differential pulse code modulators.

What is claimed is:

1. In an electrical system of the type in which a digitally encoded signal is determined at least in part by the difference between a present value of an input signal and a reference signal representative of a past value of said input signal, improved circuitry for generating said reference signal, comprising extraction means for extracting from the pattern of bits in said digitally encoded signal information relating to the time derivative of said present value to provide a corresponding control signal, said extraction means including a filter, and an envelope detector, said control signal from said extractioon means being fed to an integrating means, said integrating means being responsive to said control signal to provide said reference signal.

2. The system of claim 1 wherein said integrating means is comprised of integrating circuitry responsive to said control signal for providing said reference signal, and switching means for selecting the direction of change of said reference signal.

3. The system of claim 1 wherein said integrating means comprises integrating circuitry to provide said reference signal, said integrating circuitry having positive and negative slope control inputs controlling the direction and rate of change of said reference signal, and switching means is provided for selectively providing said control signal to said slope control inputs.

4. The system of claim 3 wherein said switching means is responsive to said encoded signal to increase or decrease said reference according to said difference between said present value and said past value.

5. The system of claim 1 further comprising modulating means for feeding back to an input of said filter a modulated signal comprising said control signal modulated by said encoded signal.

6. The system of claim 5 wherein said modulating means further comprises a selection means for selecting said input to said filter to be said modulated signal or said encoded signal.

7. The system of claim 1 whrein said extracting means further comprises a standby voltage source providing an offset to provide said control signal when said input signal is zero.

8. The system of claim 1 further comprising sampling means for providing said encoded signal, said sampling means being responsive to said input signal and said reference signal, and clock means for controlling said sampling means.

9. The system of claim 1 wherein said integrating means further comprises
  integrating circuitry to provide said reference signal, said integrating circuit having positive and negative slope control inputs controlling the direction and rate of change of said reference signal, and
  switching means being provided for selectively applying said control signal to said slope control inputs,
    said switching means being responsive to said encoded signal to increase or decrease said reference signal according to said difference between said present and past values of said input signal, and
  said extracting means further comprises
    modulating means for providing a modulated signal to be fed back to said input of said filter,
      said modulating means being responsive to said encoded signal in the manner that said modulated signal comprises said encoded amplitude modulated by said control signal, and a standby voltage sources providing an offset to provide a control signal when said input signal is zero, and said circuitry further comprises sampling means for providing said encoded signal, said sampling means responsive to said input signal and said reference signal, and clock means for controlling said sampling means.

10. The system of claim 9 wherein said clock means provides a clock output at least ten times the highest frequency of said input signal, and said filter is a low pass filter having an upper roll-off frequency of at least said highest frequency of said input signal, said envelope detector has a gain in a range of at least 1 and a hold time constant of at least the period of the lowest frequency of said input signal, and said integrating circuitry has a slew rate at the maximum value of said control signal of no more than 3 times the period of said highest frequency, said maximum value being at least the maximum amplitude of said input signal.

11. The system of claim 9 wherein said input signal has a maximum frequency of 22 KHz, said lowest frequency of 20 Hz, and said maximum amplitude of 10 volts, said clock output is at least 250 KHz, said upper roll-off frequency of said filter is at least 24 KHz, said detector has a hold time constant of at least 50 ms and a gain of at least 1.2, the maximum value of said reference is at least 10 volts, and said integrating circuitry has a slew rate of at least 0.25 v/us at said maximum control signal value and a slew rate of at least 2.5 mv/us for a value of said control signal of at least 0.1 volts.

12. The system of claim 8 wherein said clock means provides a clock output at least 10 times the highest frequency of said input signal.

13. The system of claim 12 wherein said clock output is at least 15 times the highest frequency of said input signal.

14. The system of claim 1 wherein the maximum value of said reference is at least the maximum amplitude of said input signal.

15. The system of claim 1 wherein the slew rate of said reference at the maximum value of said control signal is no greater than 3 times the period of the highest frequency of said input signal.

16. The system of claim 12 wherein said highest input frequency is 25 KHz.

17. The system of claim 13 wherein said highest input frequency is 25 KHz.

18. The system of claim 1 wherein said highest input frequency is 25 KHz.

19. The system of claim 1 wherein said period of said lowest input frequency is 50 ms.

20. The system of claim 14 wherein said maximum input signal amplitude is 10 volts.

21. The system of claim 15 wherein said period of said highest input frequency is 40$\mu$ sec.

22. The circuitry of claim 1 wherein said electrical system is a continuously variable slope delta system.

23. In an electrical system of the type in which a digitally encoded signal is determined at least in part by the difference between a present value of an input signal and a reference signal representative of a past value of said input signal, improved circuitry for generating said reference signal, comprising extraction means including a filter for extracting from the pattern of bits in said digitally encoded signal information relating to the time derivative of said present value to provide a corresponding control signal, integrating means responsive to said control signal to provide said reference signal, modulating means for feeding back to an input of said filter a modulated signal comprising said control signal modulated by said encoded signal, and means for providing as an input to said filter a mixture of said modulated signal and said digitally encoded signal, said mixture being selected to provide tracking at low slew rates between said input and the decoded output while maintaining dynamic range.

24. The system of claim 23 wherein said digitally encoded signal is from 0.03 to 3.0 percent of said mixture.

25. The system of claim 5 wherein said modulating means has a forward loop gain greater than unity, said loop gain being measured between the input to said filter and the point at which said control signal is fed back to said filter.

26. The electrical system of claim 1 wherein said filter has a cutoff frequency selected to be at least the highest frequency of the input signal.

27. The electrical system of claim 1 wherein said envelope detector includes means producing a rectified control signal that rises rapidly, to follow increases in the filter output, and decays more slowly than it rises upon decreases in the filter output.

28. The system of claim 27 wherein the speed of decay of said means producing a rectified control signal is determined by a hold time constant that is selected to be long enough to make quantization noise less audible.

29. The electrical system of claim 28 wherein said hold time constant is selected to be longer than the period of the lowest frequency of the input signal.

* * * * *